United States Patent [19]
Goto

[11] Patent Number: 5,719,430
[45] Date of Patent: Feb. 17, 1998

[54] BURIED-CHANNEL MOS TRANSISTOR AND PROCESS OF PRODUCING SAME

[75] Inventor: Yoshiro Goto, Tokyo, Japan

[73] Assignee: NEC Corporation, Tokyo, Japan

[21] Appl. No.: 747,745

[22] Filed: Nov. 12, 1996

Related U.S. Application Data

[63] Continuation of Ser. No. 681,516, Jul. 23, 1996, abandoned, which is a continuation of Ser. No. 230,778, Apr. 21, 1994, abandoned.

[30] Foreign Application Priority Data

May 1, 1993 [JP] Japan ................... 5-128024

[51] Int. Cl.$^6$ ............ H01L 29/76; H01L 29/94; H01L 31/062
[52] U.S. Cl. .......... 257/403; 257/346; 257/387; 257/404; 257/408
[58] Field of Search ............... 257/346, 387, 257/402, 403, 404, 408

[56] References Cited

U.S. PATENT DOCUMENTS 5,329,138  7/1994  Mitani et al. ................... 257/42

FOREIGN PATENT DOCUMENTS 62-122175  6/1987  Japan ................... 257/403
63-182866  7/1988  Japan ................... 257/403

OTHER PUBLICATIONS

Adele E. Schmitz, Prahalad K. Vasudev and John & Chen, "High Performance Subhalf-Micrometer P-Channel Irnasistors for CMOS VLSI" *IEEE Technical Digest* (1984), pp. 423–426.

C. Mazure, R. Subrahmanyan, C. Gunderson and M. Orlowski, "Design Considerations For Sub-0.35 μm Buried Channel P-MOSFET Devices", *IEEE VLSO Symposium, Digest of Technical Papers*, (1992) pp. 92–93.

*Primary Examiner*—Ngân V. Ngô
*Attorney, Agent, or Firm*—Foley & Lardner

[57] ABSTRACT

In fabricating a buried p-channel MOS transistor using an n-type substrate, a shallow n-type diffused layer is formed by ion implantation in each of intended source and drain regions so as to become oppositely adjacent to the shallow p-type diffused layer under the gate electrode. Then p-type diffused layers to serve as source and drain are formed by ion implantation through the n-type diffused layers, and the implanted impurities are activated. In consequence, impurity concentration at the substrate surface becomes lower in the section right under each end of the gate electrode than in the gate middle section. This measure brings about suppression of the short channel effect inherent to conventional buried-channel MOS transistors and makes it possible to shorten the physical gate length.

13 Claims, 5 Drawing Sheets

BURIED-CHANNEL MOS TRANSISTOR AND PROCESS OF PRODUCING SAME

This is a continuation of U.S. patent application Ser. No. 08/681,516, filed Jul. 23, 1996, now abandoned; which is a continuation of U.S. patent application Ser. No. 08/230,778, filed Apr. 21, 1994, now abandoned.

BACKGROUND OF THE INVENTION

This invention relates to an improved buried-channel MOS transistor and a process of producing the improved transistor.

Conventional buried p-channel MOS transistors have a shallow p-type diffused layer in an n-type substrate surface under the gate electrode and gate oxide film in order to adequately lower the threshold voltage. The shallow p-type diffused layer provides a channel between source and drain regions which are more heavily doped p-type diffused layers.

An advantage of buried-channel MOS transistors over surface channel MOS transistors is increased mobility of electric charge because of little scattering at the interface between the substrate and the gate oxide film. On the other hand, a disadvantage of buried-channel MOS transistors is susceptibility to the so-called short channel effect. That is, since the source and drain regions and the channel region are of the same type conductivity, the application of a voltage to the drain causes wider expansion of the depletion layer than in surface channel MOS transistors and hence is liable to result in a phenomenon called punch-through, i.e. flow of current between source and drain as a result of the drain voltage directly forcing down the potential energy at the boundary between source and channel. In this case the punch-through occurs in the vicinity of the substrate surface and hence is called surface punch-through. The fundamental reason for the liability to punch-through is that effective channel length becomes considerably shorter than the physical length of the gate electrode. Therefore, it is difficult to further miniaturize buried-channel MOS transistors by shortening the physical length of the gate electrode.

SUMMARY OF THE INVENTION

It is an object of the present invention to provide an improved buried-type MOS transistor in which effective channel length relative to the physical gate length is extended so that susceptibility to the short channel effect is diminished.

It is another object of the invention to provide a process of fabricating a buried-channel MOS transistor improved in the above-stated point.

A buried-channel MOS transistor according to the invention has a semiconductor substrate of first-type conductivity, a gate dielectric film formed on a surface of the substrate in a limited area, a first diffused layer of opposite second-type conductivity which is formed in a surface region of the substrate under the gate dielectric film so as to provide a channel region, a gate electrode which is formed on the gate dielectric layer, a pair of second diffused layers of the second-type conductivity which are formed in the substrate on two opposite sides of the first diffused layer so as to provide source and drain regions that are higher in impurity concentration and greater in depth from the substrate surface than the first diffused layer. As the principal feature of the invention, the channel region includes two border regions each of which is a diffused layer in a surface region of the substrate, is lower in impurity concentration than the first diffused layer and intervenes between the first diffused layer and one of the second diffused layers such that impurity concentration at the surface of the substrate is lower in a section right under each end face of the gate electrode than in sections under a central part of the gate electrode.

A fabrication process according to the invention essentially comprises the steps of (a) forming a gate dielectric film on a surface of a semiconductor substrate of first-type conductivity, (b) forming a first diffused layer of opposite second-type conductivity in a surface region of the substrate under the gate dielectric film by ion implantation of a second-type impurity, (c) forming a gate electrode having two opposite end faces on the gate dielectric film, (d) forming a pair of auxiliary diffused layers of the first-type conductivity in surface regions of the substrate so as to become oppositely adjacent to the first diffused layer existing under the gate electrode by ion implantation of a first-type impurity by using the gate electrode as mask, (e) forming a pair of second diffused layers of the second-type conductivity in intended source and drain regions of the substrate by ion implantation of a second-type impurity through major areas of the auxiliary diffused layers by using the gate electrode as mask, the second diffused layers being higher in ion concentration and greater in depth from the substrate surface than the first diffused layer, and (f) activating the impurities already implanted into the substrate by a heat treatment.

In this fabrication process the novel point is the step (d). That is, a shallow diffused layer of the same type conductivity as the substrate is formed in each of intended source and drain regions before forming the diffused layers of opposite type conductivity to provide source and drain regions. In consequence, the obtained MOS transistor has channel border regions wherein impurity concentration at the substrate surface is lower than in the main part of the channel, and the effective channel length extends. Therefore, a buried-channel MOS transistor according to the invention is hardly susceptible to the short channel effect, and hence the invention makes it possible to further miniaturize buried-channel MOS transitors by shortening the physical length of gate electrode. For example, in a buried p-channel MOS transistor it is possible to shorten the gate length to about 0.25 μm without suffering from punch-through.

Besides, the invention has the effect of suppressing deterioration of MOS transistors by the influence of hot electrons, because lowering of impurity concentration at the boundaries between the channel and the source and drain regions brings about relaxation of electric field. In this regard, the invention makes a contribution to enhancement of reliability of buried-channel MOS transistors.

DESCRIPTION OF THE PREFERRED EMBODIMENTS

Figure 1A:
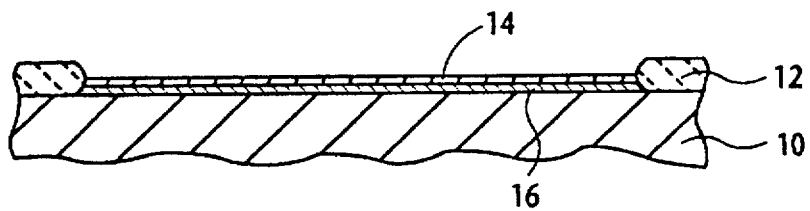
FIGS. 1(A) to 1(E) illustrate, in schematic cross-sectinal views, a first process of fabricating a buried-channel MOS transistor according to the invention.
Figure 1B:
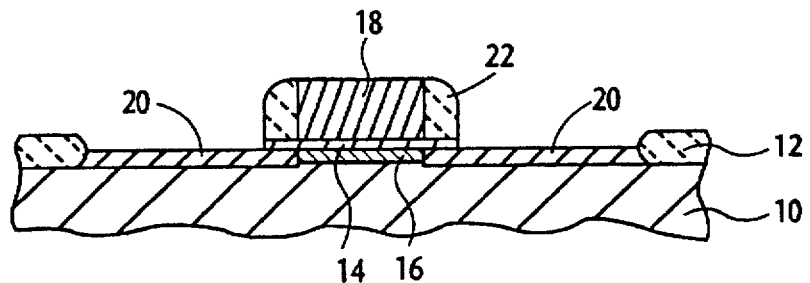
Figure 1C:
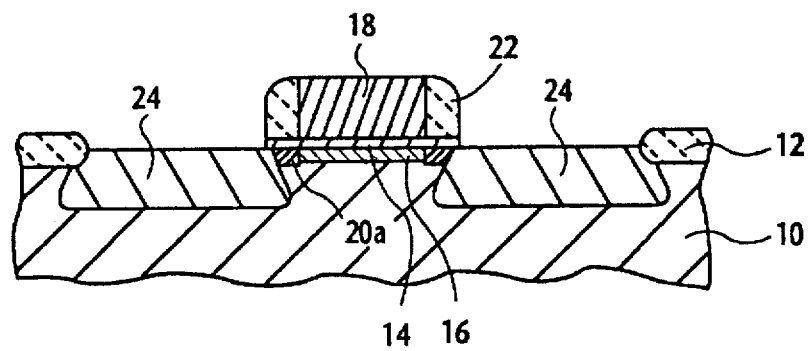
Figure 1D:
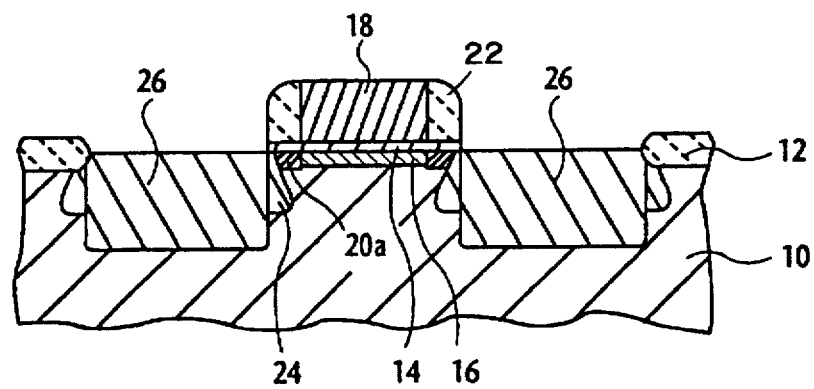
Figure 1E:
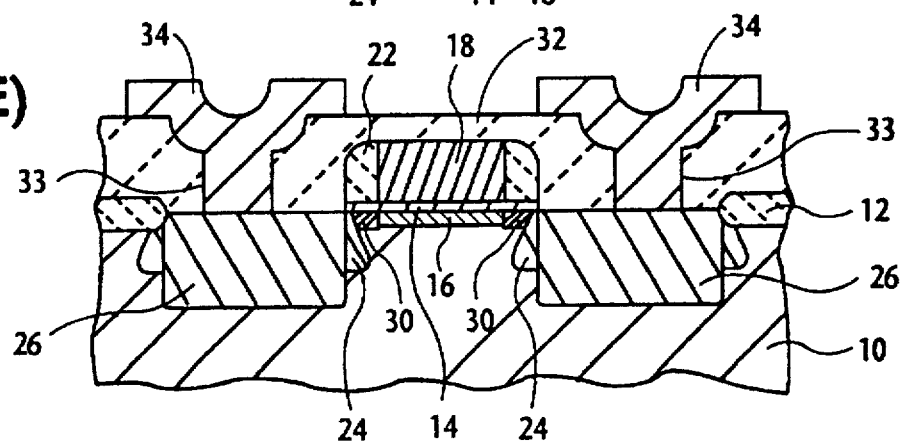

FIGS. 1(A) to 1(E) illustrate a process of fabricating a buried p-channel MOS transistor as a first embodiment of the invention. The completed structure of the transistor is seen in FIG. 1(E).

Referring to FIG. 1(A), first a relatively thick oxide film 12 is formed on an n-type silicon substrate 10 so as to provide field regions by which active regions are defined, and in each active region a gate oxide film 14 is formed on the silicon substrate surface by a suitable method such as thermal oxidation. Next, a shallow p-type diffused layer 16 is formed under the gate oxide film 14 by low-energy ion implantation of a p-type impurity into the n-type silicon substrate 10 so as to realize a desired threshold voltage. The p-type diffused layer 16 is relatively low in impurity concentration. For example, boron is implanted at 10–30 keV at a dose of $10^{12}$ to $10^{13}$/cm$^2$.

Referring to FIG. 1(B), a gate electrode 18 of polycrystalline silicon is formed on the gate oxide film 14 by using a patterning technique. Next, using the gate electrode 18 as mask, an n-type impurity is ion-implanted into the n-type silicon substrate 12 at low energy to thereby form a shallow n-type diffused layer 20 on each side of the gate electrode 18. For example, phosphorus is implanted at 10–30 keV at a dose of $10^{12}$ to $10^{14}$/cm$^2$. The p-type diffused layer 16 remains in the region right under the gate electrode 18. Next, an oxide film is grown on the substrate surface over the entire area inclusive of the gate electrode 18, for example, to a thickness of 150–200 nm, and then that oxide film is mostly removed together with the initially formed oxide film 14 by anisotropic etching so as to leave an oxide sidewall 22 on each of two opposite end faces of the gate electrode 18. Of course the oxide film 14 remains under the gate electrode 18.

Referring to FIG. 1(C), using the gate electrode 18 and sidewalls 22 as a mask, a p-type impurity is obliquely ion-implanted into the substrate 10 to thereby form a p-type diffused layer 24, which is deeper than the precedingly formed p-type and n-type diffused layers 16 and 20, on each side of the gate electrode 18. For example, boron is implanted at an angle of about 45° with the substrate surface at 30–60 keV at a dose of $10^{13}$ to $10^{14}$/cm$^2$. On each side of the gate electrode 18 a major portion of the n-type diffused layer 20 turns into a surface portion of the p-type diffused layer 24, but under the sidewall 22 an edge portion 20a of the n-type diffused layer 20 remains between the p-type diffused layer 24 and the p-type diffused layer 16 under the gate electrode 18. In the region under each sidewall 22 the concentration of the implanted p-type impurity becomes highest at a small depth from the substrate surface.

Referring to FIG. 1(D), using the gate electrode 18 and sidewalls 22 as a mask, a p-type impurity is ion implanted into the substrate 10 at a relatively high dose to thereby form a pair of p-type diffused layers 26. In this case the ion implantation is performed perpendicularly to the substrate surface or at a small angle with the perpendicular, and the p-type diffused layers 26 are made deeper than the precedingly formed p-type diffused layers 24. For example, boron difluoride $BF_2$ is implanted at 40–70 keV at a dose of $10^{15}$ to $10^{16}$/cm$^2$.

In the above described process the n-type diffused layers 20 and the p-type diffused layers 24, 26 are formed in a self-aligned manner.

After that a heat treatment is made to activate the impurities implanted by the steps illustrated in FIGS. 1(A) to 1(D).

Referring to FIG. 1(E), a dielectric layer 32 for interlayer insulation is formed on the intermediate in the state of FIG. 1(D). Then contact holes 33 are formed in the dielectric layer 32 to provide access to the p-type diffused layers 26, and by using the contact holes 33 metal wirings 34 are made for the respective p-type diffused layers 26.

In the MOS transistor shown in FIG. 1(E) a complementary diffused layer 30, which originates from an edge portion 20a of the n-type diffused layer 20, intervenes between the p-type diffused layer 16 under the gate electrode 18 and the p-type diffused layer 24 on each side. The complementary diffused layers 30 are p-type or n-type diffused layers lower in impurity concentration than the p-type diffused layer 16, because p-type impurities diffuse into the edge portions 20a of the precedently formed n-type diffused layer 20 during the ion implantation operations to form the p-type diffused layers 24 and 26 and/or the heat treatment for activation of the implanted impurities. The diffused layer 30 on each side exists right under an end of the gate electrode 18 and a part of the sidewall 22. In this MOS transistor the p-type diffused layers 24 and 26 on each side constitute a source or drain region. For each source/drain region the p-type diffused layer 24, which is relatively low in impurity concentration, provides a junction region adjacent to the gate. That is, this MOS transistor employs a so-called lightly-doped drain (LDD) structure. The p-type diffused layer 16 and the complementary diffused layers 30 jointly provide a channel region. That is, the complementary diffused layers 30 serve as channel border regions. Therefore, in this MOS transistor the boundary between either of the source and drain regions and the channel region is not right beneath an end of the gate electrode 18: the boundary is shifted to some extent toward the source or drain region. In consequence, effective channel length is extended without extending the gate length.

The primary merit of the presence of the above-described diffused layers or channel border regions 30 is that the possibility of surface punch-through is lessened. Besides, the provision of the lightly doped diffused layers 30 brings about relaxation of electric field at the boundaries between the channel region and the source and drain regions and hence is effective for suppression of the generation of hot electrons which are liable to deteriorate the MOS transistor. The effects of suppressing the occurrence of surface punch-through and the generation of hot electrons become highest when the depth of the n-type diffused layer 20 in FIG. 1(B) from the substrate surface is nearly the same as the depth of the p-type diffused layer 16.

In forming the n-type diffused layer 20 in FIG. 1(B) by ion implantation it is necessary that the projection range of the ion implantation is smaller than that of the ion implantation for forming the p-type diffused layer 24.

Figure 2:
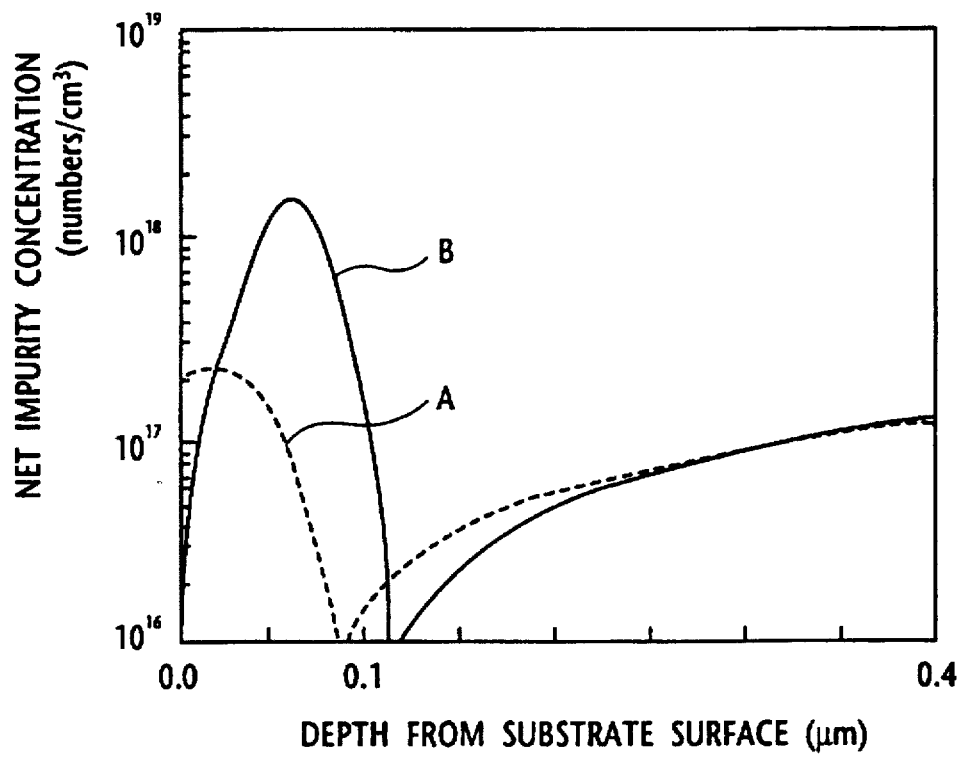
FIG. 2 is a chart showing simulated net impurity profiles in a MOS transistor produced by the process of FIGS. 1(A) to 1(E)

With respect to a MOS transistor of the structure shown in FIG. 1(E), FIG. 2 shows the result of calculation of distributions of net impurity concentrations (numbers/cm$^3$) in the silicon substrate in the thickness direction. The curve A represents impurity concentrations in the middle section of the channel region and the curve B impurity concentrations in the section right beneath each end of the gate electrode. It is seen that at the substrate surface the impurity concentration in the channel border region right under each end of the gate is lower than the impurity concentration in the channel middle region beneath the center of the gate electrode. Under the conditions employed for this calculation the channel border regions right beneath the gate ends are p-type diffused layers very low in impurity concentration, but under some other conditions the channel border regions become n-type diffused layers very low in impurity concentration.

Figure 3:
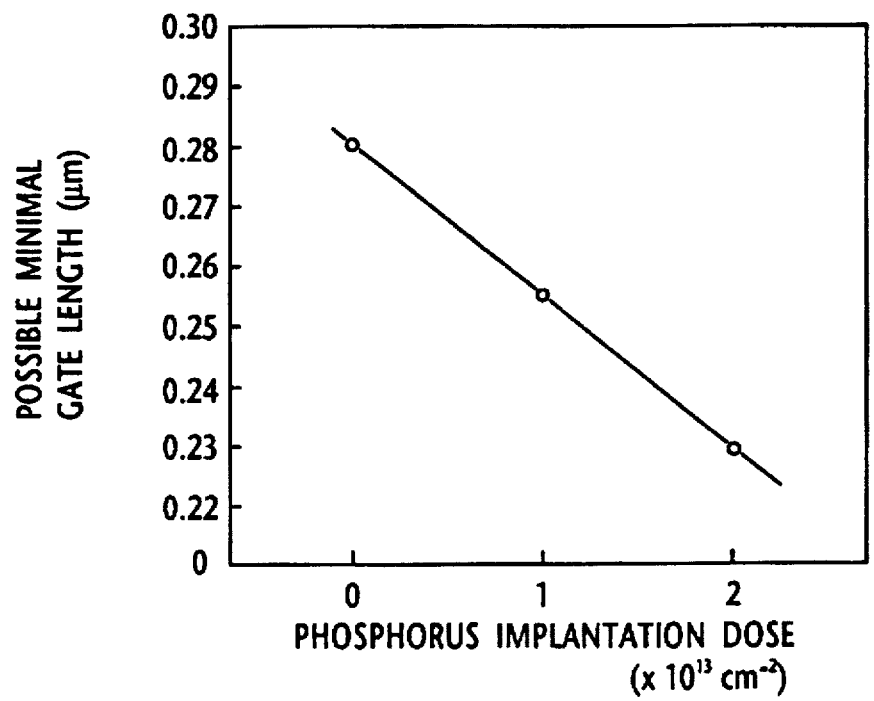
FIG. 3 is a graph showing the result of an experiment as to shortening of gate length that can be accomplished by the invention.

An experiment was conducted to confirm the possibility of shortening the physical length of the gate electrode 18 in a buried p-channel MOS transistor according to the invention. In the experiment the gate electrode 18 was formed in various lengths, and in forming the n-type diffused layers 20 by ion implantation of phosphorus at constant energy of 20 keV the phosphorus implantation dose was varied. On each of the obtained MOS transistor samples a constant voltage was applied to the drain while the source, gate and the substrate were grounded to test whether surface punch-through occurs or not. As a result of the experiment, FIG. 3 shows the relationship between the phosphorus implantation dose and a minimal length of the gate electrode to satisfy the condition that surface punch-through should be avoided. It is evident that the physical gate length can be shortened by forming the n-type diffused layers 20 before forming the p-type diffused layers which become the source and drain regions.

Figure 6A:
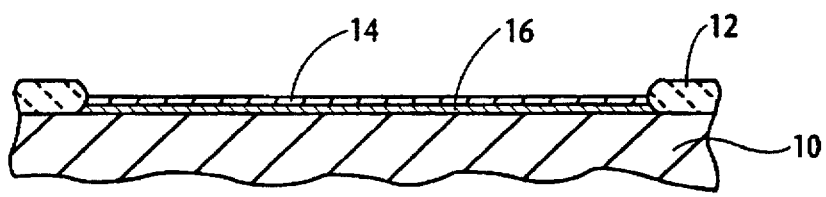
FIGS. 6(A) to 6(D) illustrate a conventional process of fabricating a buried-channel MOS transistor.
Figure 6B:
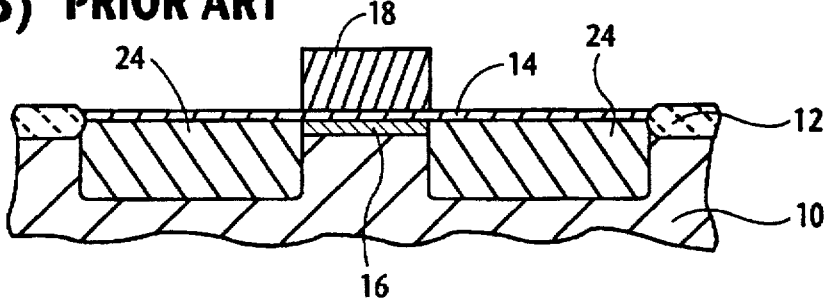
Figure 6C:
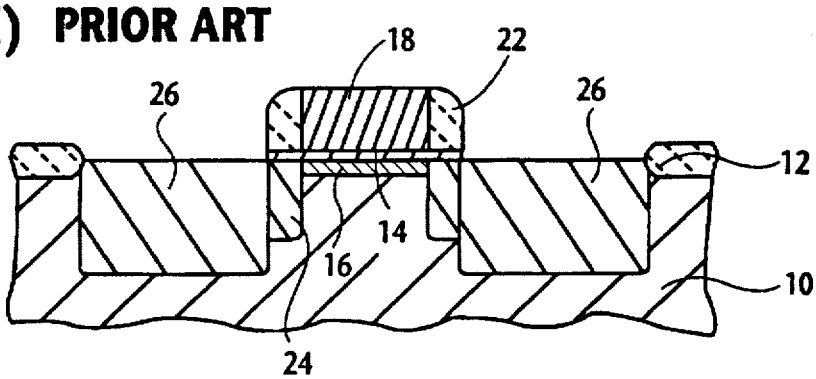
Figure 6D:
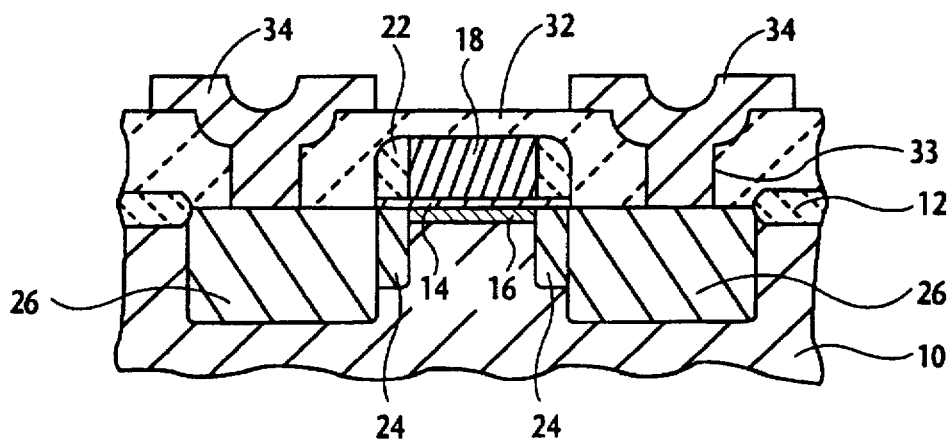

For comparison, FIGS. 6(A) to 6(D) illustrate a conventional process of fabricating a buried p-channel MOS transistor. The completed structure of the transistor is seen in FIG. 6(D).

As shown in FIG. 6(A) which is identical with FIG. 1(A), a field oxide film 12 and a gate oxide film 14 are formed on an n-type silicon substrate 10, and then a shallow and lightly doped p-type diffused layer 16 is formed under the gate oxide film 14 by ion implantation.

Referring to FIG. 6(B), a gate electrode 18 of n-type polycrystalline silicon is formed on the gate oxide film 14. Next, using the gate electrode 18 as mask, ion implantation is performed to form a pair of p-type diffused layers 24 which are deeper than the p-type diffused layer 16 and higher in impurity concentration.

Referring to FIG. 6(C), oxide sidewalls 22 are formed on the end faces of the gate electrode 18 by first growing an oxide film on the substrate surface over the entire area inclusive of the gate electrode 18 and then removing most of the oxide film by anisotropic etching. Next, using the gate electrode 18 and sidewalls 22 as mask, a p-type impurity is ion-implanted into the substrate to form a pair of p-type diffused layers 26 which are higher in impurity concentration than the precedingly formed p-type diffused layers 24. After that a heat treatment is made to activate the impurities already implanted into the substrate 10. Thus, in this process no n-type impurity is implanted into the substate.

Finally, as shown in FIG. 6(D), a dielectric layer 32 for interlayer insulation is formed over the entire area, and metal wirings 34 for the p-type diffused layers 26 are made by using contact holes 33 in the dielectric layer 32.

In the thus produced MOS transistor the p-type diffused layers 24 and 26 on each side of the gate electrode 18 constitute a source or drain region, and the shallow p-type diffused layer 16 under the gate electrode 18 becomes a channel region. Therefore, in this MOS transistor the channel length does not exceed the length of the gate electrode.

As a second embodiment of the invention, FIGS. 4(A) to 4(D) illustrate another process of fabricating a buried p-channel MOS transistor.

Figure 4A:
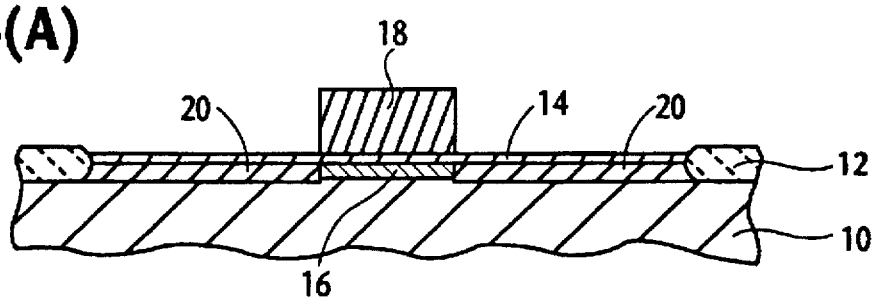
FIGS. 4(A) to 4(D) illustrate, in schematic cross-sectional views, a second process of fabricating a buried-channel MOS transistor according to the invention.

Referring to FIG. 4(A), in the same way as in the first embodiment, a field oxide film 12, a gate oxide film 14 and a gate electrode 18 are formed on an n-type silicon substrate 10, and a shallow and lightly doped p-type diffused layer 16 is formed under the gate oxide film 14, and then an n-type diffused layer 20 is formed on each side of the gate electrode 18.

Figure 4B:
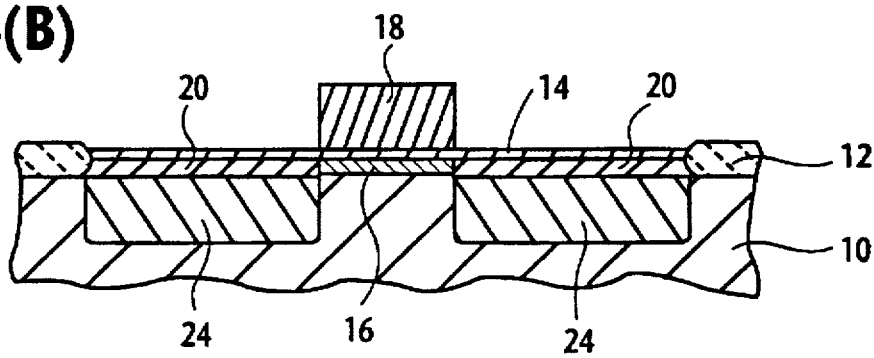

Next, referring to FIG. 4(B), using the gate electrode 18 as mask, a p-type impurity is ion-implanted into the substrate 10 perpendicularly to the substrate surface or at a small angle with the perpendicular to thereby form a pair of p-type diffused layers 24. For example, boron is implanted at 15–70 keV at a dose of $10^{12}$ to $10^{14}$/cm$^2$.

Figure 4C:
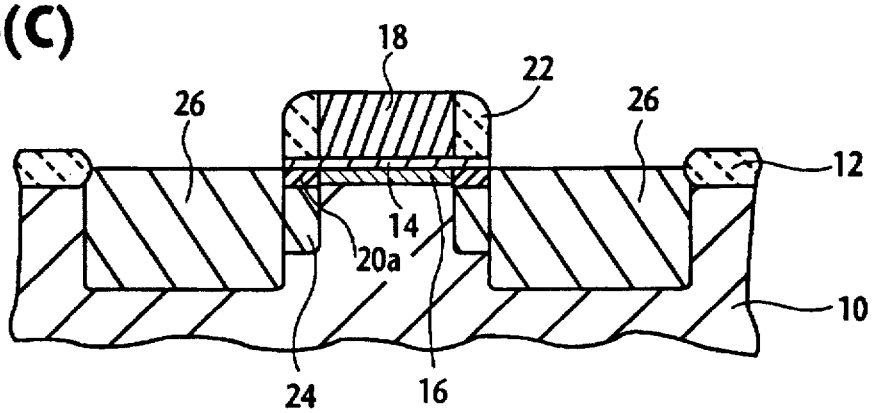

Referring to FIG. 4(C), oxide sidewalls 22 are formed on the end faces of the gate electrode 18 by the method described hereinbefore. Next, using the gate electrode 18 and sidewalls 22 as a mask, a p-type impurity is ion-implanted into the substrate perpendicularly to the substrate surface or at a small angle with the perpendicular to thereby form a pair of p-type diffused layers 26 which are higher in impurity concentration than the precedingly formed p-type diffused layers 24. For example, BF$_2$ is implanted at 40–70 keV at a dose of $10^{15}$ to $10^{16}$/cm$^2$. After that a heat treatment is made to activate the impurities already implanted into the substrate 10.

Figure 4D:
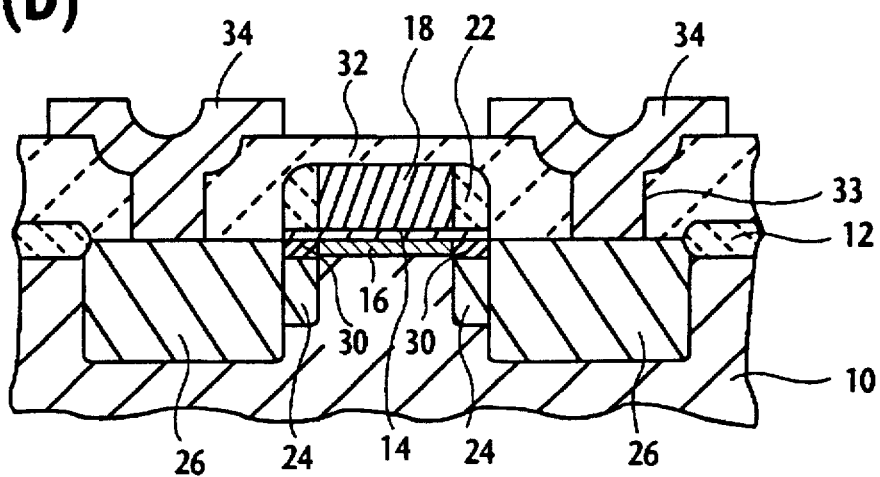

As shown in FIG. 4(D), the MOS transistor is completed by forming a dielectric layer 32 for interlayer insulation and then making metal wirings 34 for the source and drain regions by using contact holes 33 in the dielectric layer 32. In this MOS transistor the main part of the channel region is the p-type diffused layer 16, but the channel region includes channel border regions 30 each of which exists right under an end of the gate electrode 18 and the sidewall 22. The channel border regions 30 are p-type or n-type diffused layers lower in impurity concentration than the p-type diffused layer 16 as a result of diffusion of p-type impurities into edge portions 20a of the n-type diffused layer 20 during the ion implantation operations and/or the activating heat treatment. Therefore, the MOS transistor of FIG. 4(D) has the same advantages as the MOS transistor of FIG. 1(E).

Figure 5A:
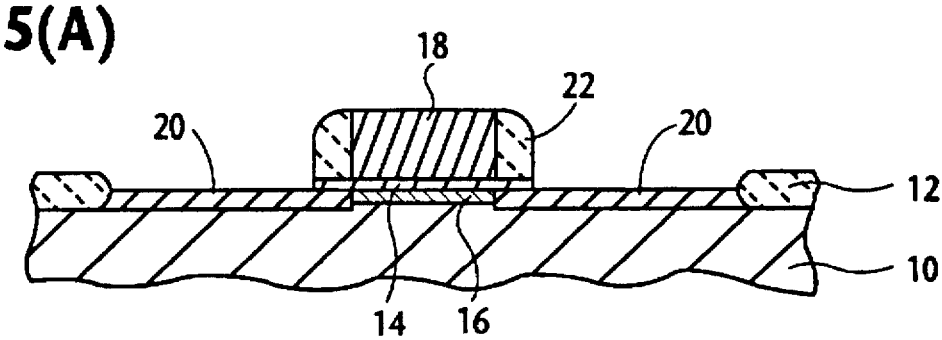
FIGS. 5(A) to 5(C) illustrate, in schematic cross-sectional views, a third process of fabricating a buried-channel MOS transistor according to the invention.
Figure 5B:
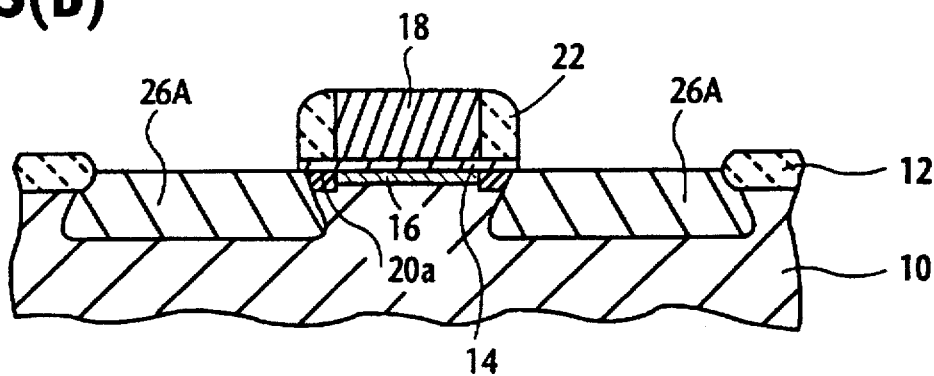
Figure 5C:
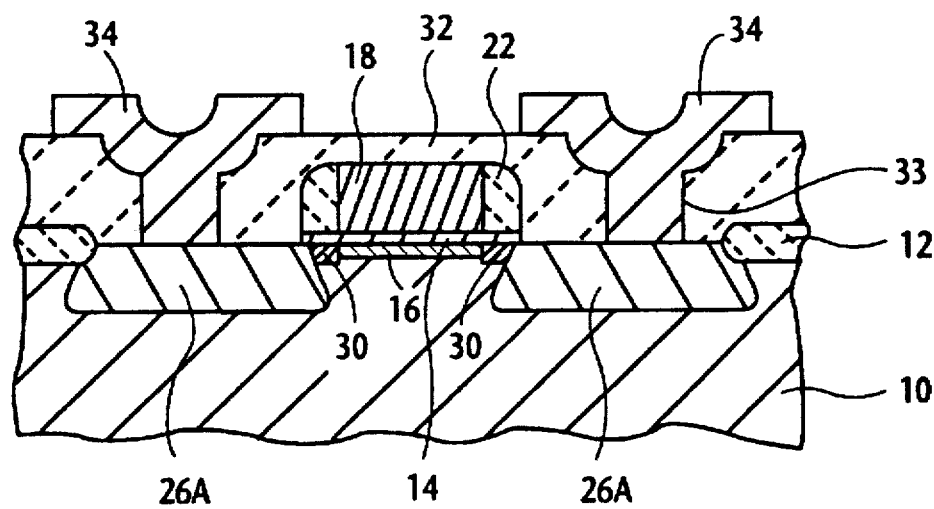

As a third embodiment of the invention, FIGS. 5(A) to 5(C) illustrate another process of fabricating a buried p-channel MOS transistor.

FIG. 5(A) is identical with FIG. 1(B). That is, this process incorporates an initial part of the first embodiment until the formation of sidewalls 22 on the gate electrode 18 after forming the n-type diffused layer 20.

Referring to FIG. 5(B), using the gate electrode 18 and sidewalls 22 as mask, a p-type impurity is ion-implanted into the n-type substrate 10 perpendicularly or obliquely to the substrate surface to thereby form a pair of p-type diffused layers 26A which are higher in impurity concentration than the p-type diffused layer 16 under the gate electrode 18. For example, BF$_2$ is implanted at an angle of 30°–45°, at 40–80 keV and at a dose of $10^{15}$ to $10^{16}$/cm$^2$. After that a heat treatment is made to activate the impurities already implanted into the substrate. For example, the heat treatment is carried out at 850° C. for about 30 min.

Referring to FIG. 5(C), the dielectric layer 32 for interlayer insulation and the metal wirings 34 for the source and drain regions 26A are provided in the same manner as in the preceding embodiments. In this MOS transistor the channel region includes channel border regions 30 each of which is right under an end of the gate electrode 18 and a part of the sidewall 22. The channel border regions 30 are p-type or n-type diffused layers lower in impurity concentration than the p-type diffused layer (the main part of the channel) 16 as a result of diffusion of p-type impurities into the edge portions 20a of the n-type diffused layer 20. Therefore, this MOS transistor has the same advantages as the MOS transistor of FIG. 1(E).

In any of the above described embodiments of the invention the material of the gate electrode 18 may be changed from polycrystalline silicon to a silicide of a metal having a high melting point, such as tungsten silicide by way of example.

Of course it is optional to modify any of the above described embodiments to a process of fabricating a buried n-channel MOS transistor by using a p-type semiconductor substrate and reversing the "p-type" and "n-type" mentioned in each embodiment.

What is claimed is:

1. A buried-channel MOS transistor formed in a semiconductor substrate of first-type conductivity, comprising:

a gate dielectric film formed on a surface of said substrate;

a gate electrode formed on said gate dielectric film, said gate electrode having two opposite end faces;

a buried-channel layer of opposite second-type conductivity formed in a surface region of said substrate under said gate dielectric film and said gate electrode, said buried-channel layer being a first diffused layer;

source and drain regions formed in said substrate on two opposite sides of said first diffused layer, each of said source and drain regions comprising a second diffused layer of said second-type conductivity and a third diffused layer of said second-type conductivity which incorporates a major part of said second diffused layer and is higher in impurity concentration and greater in depth from said substrate surface than said first diffused layer; and a pair of auxiliary diffused layers formed in said surface region of said substrate on two opposite sides of said first diffused layer, with each of said auxiliary diffused layers intervening between an end of said buried-channel layer and one of said second diffused layers of said source and drain regions, said auxiliary diffused layers being lower in impurity concentration than said buried-channel layer and than said second diffused layer.

2. A buried-channel MOS transistor according to claim 1, wherein each of said opposite end faces of said gate electrode is covered by a dielectric sidewall; and each of said auxiliary diffused layers being located under at least a portion of one of said dielectric sidewalls.

3. A buried-channel MOS transistor according to claim 1, wherein said auxiliary diffused layers each have a depth from said substrate surface approximately equal to a depth from said substrate surface for said buried-channel layer.

4. A buried-channel MOS transistor according to claim 1, wherein said auxiliary diffused layers are of said second-type conductivity.

5. A buried-channel MOS transistor according to claim 1, wherein said auxiliary diffused layers are of said first-type conductivity.

6. A buried-channel MOS transistor formed in a semiconductor substrate of first-type conductivity comprising:

a gate dielectric film formed on a surface of said substrate;

a gate electrode which is formed on said gate dielectric film, said gate electrode having two opposite end faces, each of said end faces being covered by a dielectric sidewall;

a buried-channel layer of opposite second-type conductivity formed in a surface region of said substrate underneath said gate dielectric film and said gate electrode, said buried-channel layer being a first diffused layer;

a source and a drain region formed in said substrate on two opposite sides of said first diffused layer, wherein each of said source and drain regions has a second diffused layer of said second-type conductivity, said second diffused layer being greater in depth from said substrate surface than a depth of said buried-channel layer, and each of said second diffused layers having an end portion underneath one of said dielectric sidewalls of said gate electrode, and each of said source and drain regions further including a third diffused layer of said second-type conductivity, said third diffused layer incorporating a major part of said second diffused layer and being higher in impurity concentration and greater in depth from said substrate surface than said second diffused layer; and a pair of auxiliary diffused layers, each of said auxiliary diffused layers being formed in said surface region of said substrate and intervening between an end of said buried-channel layer and one of said end portions of said second diffused layer of one of said source and drain regions, said auxiliary diffused layers being lower in impurity concentration than said buried-channel layer and lower in impurity concentration than said second diffused layer.

7. A buried-channel MOS transistor according to claim 6, wherein said auxiliary diffused layers are approximately the same depth from said substrate surface as said buried-channel layer.

8. A buried-channel MOS transistor according to claim 6, wherein said auxiliary diffused layers are of said second-type conductivity.

9. A buried-channel MOS transistor according to claim 6, wherein said auxiliary diffused layers are of said first-type conductivity.

10. A buried-channel MOS transistor formed in a semiconductor substrate of first-type conductivity, comprising:

a gate dielectric film formed on a surface of said substrate;

a gate electrode being formed on said gate dielectric film and having two opposite end faces, each of said opposite end faces being covered by a dielectric sidewall;

a buried-channel layer of opposite second-type conductivity being formed in a surface region of said substrate underneath said gate dielectric film and said gate electrode, said buried-channel layer being a first diffused layer;

source and drain regions being formed in said substrate on two opposite sides of said first diffused layer, each of said source and drain regions having a second diffused layer of said second-type conductivity, said second diffused layer being greater in depth from said substrate surface than a depth of said buried-channel layer, and having an end portion positioned underneath one of said dielectric sidewalls on said opposite end faces of said gate electrode, and each of said source and drain regions having a respective third diffused layer of said second-type conductivity, said third diffused layers incorporating said second diffused layers of respective source and drain regions with the exception of said end portions of said second diffused layers, and said third diffused layers being higher in impurity concentration and greater in depth from said substrate surface than said second diffused layers; and a pair of auxiliary diffused layers, each of said auxiliary diffused layers being positioned in said surface region of said substrate and extending from an end of said buried-channel layer to one of said end portions of said second diffused layers of said source and drain regions, said auxiliary diffused layers being lower in impurity concentration than said buried-channel layer and said second diffused layers.

11. A buried-channel MOS transistor according to claim 10, wherein said auxiliary diffused layers having approximately the same depth from said substrate surface as said buried-channel layer.

12. A buried-channel MOS transistor according to claim 10, wherein said auxiliary diffused layers are of said second-type conductivity.

13. A buried-channel MOS transistor according to claim 10, wherein said auxiliary diffused layers are of said first-type conductivity.

* * * * *